(12) United States Patent
Kihara et al.

(10) Patent No.: US 6,635,323 B2
(45) Date of Patent: Oct. 21, 2003

(54) RAW MATERIAL FOR PRODUCTION OF GAAS CRYSTALS

(76) Inventors: Tadashi Kihara, 24-1-202, Higashiohizumi 6-chome, Nerima-ku, Tokyo, 178-0063 (JP); Takeharu Yamamura, Asahipurazahachioji 307, 6-15, Akatsuki-cho 2-chome, Hachioji-shi, Tokyo, 192-0042 (JP); Kenichi Tayama, 9-14, Fujisaki 3-chome, Narashino-shi, Chiba, 275-0017 (JP)

( * ) Notice: Subject to any disclaimer, the term of this patent is extended or adjusted under 35 U.S.C. 154(b) by 173 days.

(21) Appl. No.: 09/777,648

(22) Filed: Feb. 6, 2001

(65) Prior Publication Data

US 2001/0012547 A1 Aug. 9, 2001

(30) Foreign Application Priority Data

Feb. 7, 2000 (JP) ......................................... 2000-028993

(51) Int. Cl.⁷ ..................... B29D 22/00; B29D 23/00; B32B 1/08; B32B 15/01
(52) U.S. Cl. ...................... 428/35.3; 428/620; 428/642; 428/688; 428/689; 428/457
(58) Field of Search ................................. 428/620, 642, 428/35.3, 689, 688, 457; 117/954; 252/62.36 A

(56) References Cited

U.S. PATENT DOCUMENTS 3,944,393 A * 3/1976 Schierding et al. ........... 23/273
4,776,971 A * 10/1988 Mattera et al. ............. 252/62.3

FOREIGN PATENT DOCUMENTS

JP                    359152300 A    *    8/1984   ........... C30B/29/40

* cited by examiner

Primary Examiner—Harold Pyon
Assistant Examiner—Michael C. Miggins
(74) Attorney, Agent, or Firm—Willkie Farr & Gallagher

(57) ABSTRACT

The present invention provides a raw material 1 used for production of GaAs crystals by utilizing solidification of melt, wherein As 12 is accommodated in the inside of Ga 10, 11. Because As 12 is covered with Ga 10, 11, As 12 is not brought into contact with the air and can thus be conveyed without oxidizing As 12. The raw material 1 can be heated and melted as such to produce GaAs crystals by the Czochralski method.

4 Claims, 2 Drawing Sheets

RAW MATERIAL FOR PRODUCTION OF GAAS CRYSTALS

BACKGROUND OF THE INVENTION

1. Field of the Invention

The present invention relates to a raw material used for production of GaAs single crystals or GaAs polycrystals by utilizing solidification of melt in a process such as the Czochralski method (drawing method).

2. Description of the Related Art

In recent years, various semiconductor devices such as LSI, lasers, and LED attain high density and high performance, thus realizing high performance and miniaturization of various electronic parts and electrical appliances. Particularly a GaAs substrate which works at a rate several times higher than silicon, consumes less electric power and is highly resistant to noises, is used often in high-speed and high-frequency elements such as FET, IC etc. This GaAs substrate is produced thorough slicing and various procedures for processing of single-crystal ingots grown by a process of utilizing solidification of melt, for example by the Czochralski method or Bridgman process.

When this GaAs substrate is used to form e.g. an optical film element, the density of carriers in the film layer should be reduced. For this reduction, As oxides present in As used as a starting material should be removed at the maximum degree in order to render As highly purified for production of GaAs single-crystal ingots. Further, a film of GaAs etc. is important as an element-separating film for electrically separating element base materials or elements from one another, and it is known that for making this kind of film highly resistant, transition metals such as iron and nickel are added to the film in order to utilize the deep orbital formed by these transition metals.

However, if As oxides are present in this kind of film, the film is prevented from becoming highly resistant, thus failing to achieve the desired characteristics. Further, if single-crystal ingots are produced from a material contaminated with As oxides by the Czochralski method, the As oxides remain as insolubles in the melt, thus preventing the melt from forming single crystals upon solidification, and thus single-crystal ingots having large diameters cannot be produced.

On the other hand, As is easily oxidized, and when left in the air, it reacts immediately with oxygen to form As oxides. Accordingly, when GaAs single crystals are produced by the Czochralski method, As used as the raw material is carried after introduction into an ampoule with an inert gas sealed therein, and just before use for production, the ampoule is opened and introduced into a crucible.

For the conventional production of GaAs semiconductors as described above, As i.e. one component in GaAs is easily oxidized so that in preventing As from contacting the air, it should be introduced into an ampoule for shipping, resulting in an increase in costs. Further, it is troublesome for the ampoule to be opened for taking As, and it is also problematic that As may be scattered upon opening of the ampoule. In addition, if the ampoule is opened in the air, oxidation of As is immediately initiated to form arsenious acid ($AS_2O_3$) on the surface of As before the crucible is filled with an inert gas.

The $AS_2O_3$ formed on the surface of As can be removed by heating As in the crucible under predetermined conditions, but this requires an additional heating step to lower productivity. In addition, toxic amorphous $AS_2O_3$ is generated by heating. Further, the $AS_2O_3$ removed should be dealt with.

SUMMARY OF THE INVENTION

Accordingly, the object of the present invention is to provide a raw material used for production of GaAs single crystals or GaAs polycrystals, which can be carried without requiring an ampoule etc. and without oxidizing As.

To achieve this object, the present invention provides a raw material for production of GaAs crystals which is used in production of GaAs single crystals or GaAs polycrystals by utilizing solidification of melt, wherein As is accommodated in the inside of Ga.

In another aspect, the present invention provides a raw material for use in production of GaAs single crystals or GaAs polycrystals by utilizing solidification of melt, wherein As is accommodated in a sealed space formed in the inside of Ga.

In this other aspect, the sealed space is preferably an inert gas atmosphere or a vacuum.

In the present invention, the purity of Ga and/or As is e.g. 99.9999% by weight or more. Because As is highly volatile and can partially volatilize during production of GaAs ingots, it is preferable that the ratio of As atoms to Ga atoms is selected suitably such that, for example, As/Ga becomes equal to or smaller than 1.5.

Since As is covered with Ga in the raw material of the present invention, As is not brought into contact with the air. Accordingly, the raw material can be carried without oxidizing As. The raw material of the present invention can be introduced as such into a crucible, then heated and melted, from which GaAs polycrystals and GaAs single crystals can grow by a process such as Czochralski or Bridgman process to produce single-crystal ingots. The GaAs single-crystal ingots thus produced serve as high-purity semiconductor material containing no or less As oxides, so that by slicing the GaAs single-crystal ingots produced, the most suitable high-purity GaAs substrate for production of high-density and high-performance semiconductor devices in recent years can be obtained.

According to the present invention, it becomes unnecessary to fill an ampoule with As prior to shipping, thus reducing the operation and realizing a reduction in costs, and further the procedure of opening the ampoule becomes unnecessary, thus facilitating production of GaAs single crystals. By previously regulating the amount of As and Ga constituting the raw material of the present invention, a desired amount of GaAs single crystals can be produced, and a waste of the starting materials can be eliminated.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments. In the drawings.

DETAILED DESCRIPTION OF THE PREFERRED EMBODIMENTS

Figure 1:
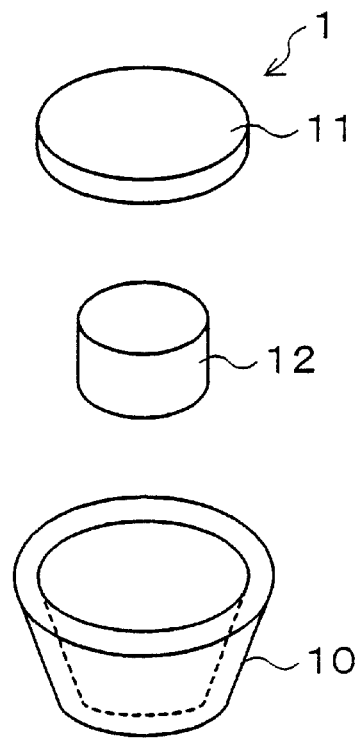
FIG. 1 is an illustration showing each element in the raw material in one embodiment of the present invention.

Hereinafter, the preferred embodiment of the present invention is described by reference to the drawings.

The raw material 1 shown in the drawings is provided with a vessel 10 having an opening at the top, a lid 11 for closing the opening of the vessel 10, and an As material 12 of purity as high as e.g. 99.9999 weight-% or more to be introduced into the vessel 10. Both vessel 10 and lid 11 are composed of a Ga material of purity as high as e.g. 99.9999 weight-% or more. The As material 12 is e.g. powder and kept so as to be prevented from being oxidized until it is introduced into the vessel 10.

Then, the As material 12 is introduced into the vessel 10 in an inert gas atmosphere, for example in $N_2$ gas or Ar gas or a mixed gas thereof. In this case, the ratio (As/Ga) of As atoms in the As material 12 to Ga atoms in the Ga material constituting both vessel 10 and lid 11 is suitably selected suitably such that As/Ga becomes equal to or smaller than 1.5. The highly purified As material 12 can be introduced directly into the vessel 10 in order to introduce the As material 12 into the vessel 10. Alternatively, the vessel 10 may be integrated into a device for highly purifying As, followed by introducing the As material 12 into the vessel 10.

Figure 2:
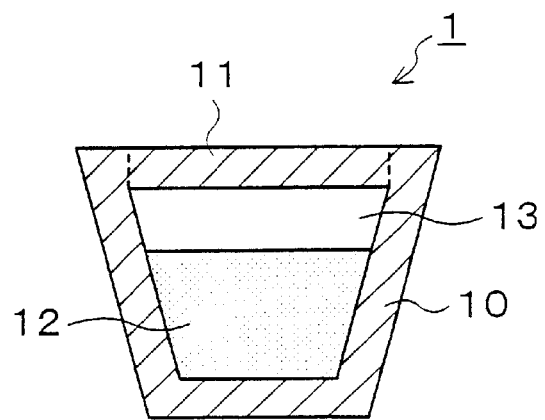
FIG. 2 is a sectional view of the raw material in one embodiment of the present invention.

Then, the opening of the vessel 10 is closed with the lid 11, and the contact region between the periphery of the lid 11 and the opening of the vessel 10 is heated to a temperature of 30° C. or more by e.g. a heater coated with Teflon, and then left to be cooled to solidify Ga, whereby the vessel 10 is sealed. In the raw material 1 thus obtained, the As material 12 is accommodated in a sealed space 13 formed in the inside of the vessel 10 and lid 11 made of Ga, as shown in FIG. 2. The operation of filling the vessel 10 with the As material 12 can be conducted in an inert gas atmosphere in order to maintain the sealed space 13 in the inert gas atmosphere.

The raw material 1 is stored at a temperature of not higher than the melting point of Ga (29.7° C.) and preferably at 10° C. or less. Further, it is stored preferably in an inert gas atmosphere or in vacuum to prevent deterioration of outside Ga.

Figure 3:
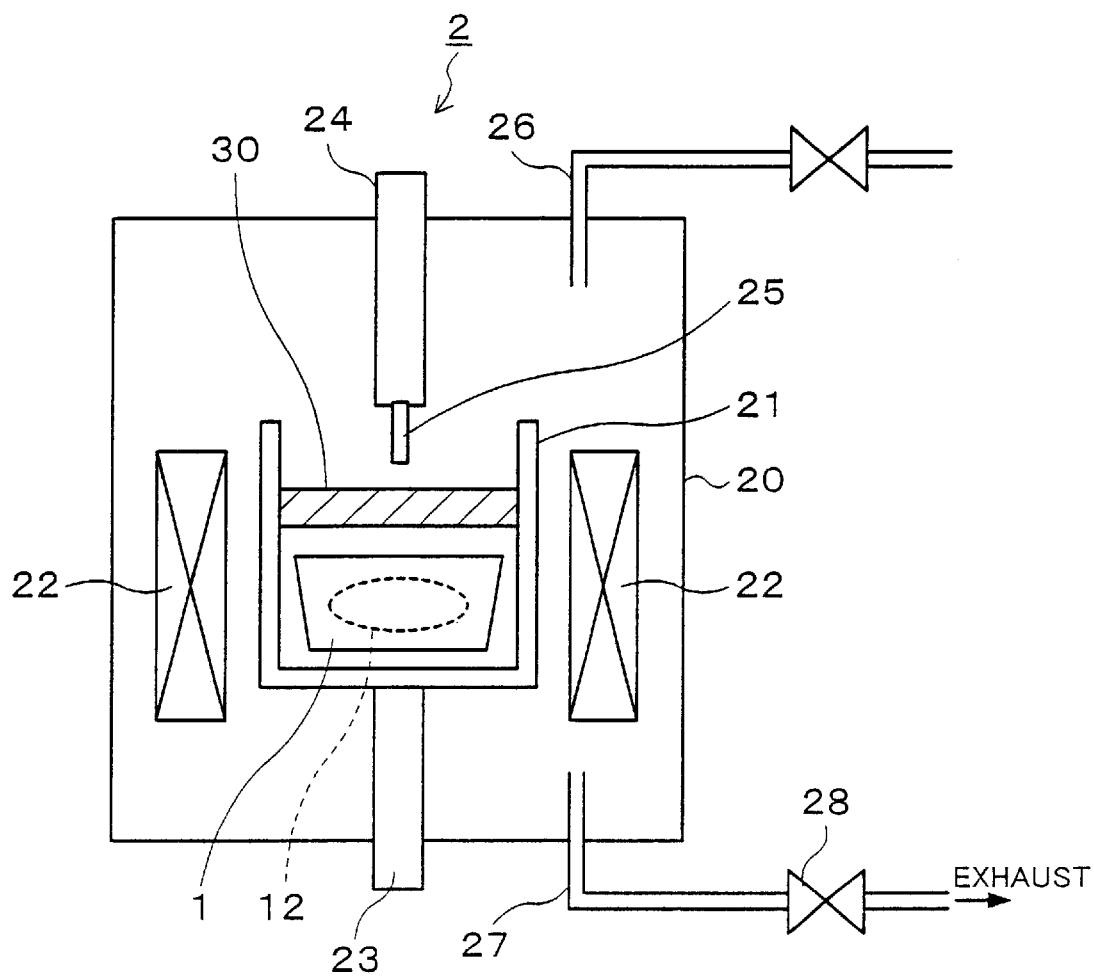
FIG. 3 is an illustration showing the constitution of a crystal-growing device for producing GaAs single crystals from the raw material in one embodiment of the present invention by the Czochralski method.

FIG. 3 is an illustration showing the constitution of a crystal-growing device 2 for producing GaAs single crystals from the raw material 1 by the Czochralski method. In the crystal-growing device 2, heater 22 is arranged around crucible 21 in a pressure vessel 20, and the crucible 21 is supported such that it is arbitrarily raised, lowered and rotated by a lower axis 23 inserted upwards into the pressure vessel 20. An upper axis 24 inserted downwards into the pressure vessel 20 is arranged over the crucible 21. Nucleating crystal 25 of GaAs single crystal cut out in predetermined orientation is attached to the lower end of the upper axis 24.

Further, an inert gas-introducing tube 26 is connected to the top of the pressure vessel 20, while a gas-exhausting tube 27 is connected to the bottom thereof. The inert gas-introducing tube 26 is to pressurize and feed an inert gas such as Ar gas or $N_2$ gas into the pressure vessel 20. Valve 28 is attached to the gas-exhausting tube 27, and the valve 28 is opened to release the gas therein to the outside, thus regulating the pressure in the pressure vessel 20.

When the crystal-growing device 2 shown in FIG. 3 is used to produce GaAs single crystals by the Czochralski method, the raw material 1 described above in FIGS. 1 and 2 is first introduced into the crucible 21, and then a liquid sealing compound 30 composed of $B_2O_3$ is placed on the raw material 1. Then, an inert gas is fed via the inert gas-introducing tube 26 to pressurize the pressure vessel 20, and the raw material 1 in the crucible 21 is heated by heater 22. The vessel 10 and lid 11 (Ga material) and the As material 12 constituting the raw material 1 are thus melted to form GaAs melt in the crucible 21. The liquid sealing compound 30 is melted in a form to cover the surface of the GaAs melt, thus preventing evaporation of As from the GaAs melt.

Thereafter, the nucleating crystal 25 attached to the lower end of the upper axis 24 is rotated at e.g. 3 to 10 rpm and gradually lowered until it is brought into contact with the surface of the GaAs melt in the crucible 21. At the same time, the crucible 21 containing the GaAs melt is rotated at a revolution rate of e.g. 10 to 40 rpm. After the nucleating crystal 25 is thus brought into contact with the GaAs melt, the rotating nucleating crystal 25 is raised at a predetermined rate to grow GaAs single crystals. After it was raised, GaAs single crystals can be obtained after cooling under predetermined conditions.

Accordingly, the As material 12 is covered with the vessel 10 and lid 11 (Ga material) in the raw material 1 in the embodiment of the present invention, so that when the raw material 1 is carried into e.g. the crystal-growing device 2, the As material 12 is not brought into contact with the air, thus preventing the As material 12 from being oxidized. The raw material 1 is introduced as such into the crucible 21, heated and melted, whereby ingots of GaAs polycrystals or GaAs single crystals can be produced. The GaAs single-crystal ingots thus produced can serve as high-purity semiconductor material containing no or less As oxides, to give the most suitable high-purity GaAs substrate for production of high-density and high-performance semiconductor devices in recent years.

Figure 4:
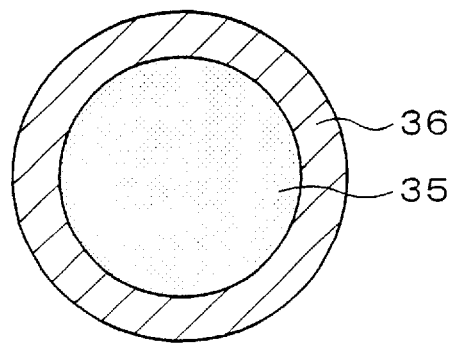
FIG. 4 is a sectional view of the raw material in another embodiment of the present invention.

A preferable embodiment of the present invention is described above, but the present invention is not limited to the above-described embodiment. For example, the Ga material may not necessarily be shaped into the vessel 10 or lid 11 and may shaped into any form insofar as As is accommodated in a sealed state in the inside of Ga. For example, As 35 may be merely tightly covered with Ga 36 thereby allowing As 35 to be accommodated in a sealed state in the inside of Ga 36, as shown in the raw material 2 in another embodiment in FIG. 4.

Further, the raw material of the present invention can also be applied to other processes (e.g. Bridgman process) for producing GaAs single crystals by utilizing solidification of melt. Further, the raw material of the present invention may be utilized as the raw material for production of GaAs polycrystals, which is used in e.g. the VGF process or the VB process.

The present invention is not limited to the embodiments described above. The above-described embodiments are shown for easier understanding of the present invention and not intended to limit the scope of the present invention, and the present raw material can be improved, modified etc. in various ways by the sprit of the present invention.

What is claimed is:

1. A vessel/raw material for production of GaAs crystals comprising: an oxidation-sensitive material comprising As; a lid having a solid-state from consisting essentially of Ga;

the vessel having a solid-state form consisting essentially of Ga and having a sealed space; wherein the oxidation-sensitive material is contained in a sealed state within the sealed space of the vessel.

2. The raw material for production of GaAs crystals according to claim 1, wherein the sealed space is an inert gas atmosphere or a vacuum.

3. The raw material for production of GaAs crystals according to claim 1, wherein the purity of Ga and/or As is 99.9999% by weight or more.

4. The raw material for production of GaAs crystals according to claim 1, wherein the ratio of As atoms to Ga atoms (As/Ga) is equal to or smaller than 1.5.

* * * * *